(12) United States Patent
Ellis et al.

(10) Patent No.: US 9,093,160 B1
(45) Date of Patent: Jul. 28, 2015

(54) METHODS AND SYSTEMS FOR STAGGERED MEMORY OPERATIONS

(71) Applicant: SanDisk Enterprise IP LLC, Milpitas, CA (US)

(72) Inventors: Robert W. Ellis, Phoenix, AZ (US); James M. Higgins, Chandler, AZ (US); Vidyabhushan Mohan, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/298,843

(22) Filed: Jun. 6, 2014

Related U.S. Application Data

(60) Provisional application No. 62/005,920, filed on May 30, 2014.

(51) Int. Cl.
*G11C 16/10* (2006.01)
(52) U.S. Cl.
CPC .................................... *G11C 16/10* (2013.01)
(58) Field of Classification Search
None
See application file for complete search history.

(56) References Cited

U.S. PATENT DOCUMENTS

| | | | |
|---|---|---|---|
| 4,916,652 A | 4/1990 | Schwarz et al. |
| 5,270,979 A | 12/1993 | Harari et al. |
| 5,519,847 A | 5/1996 | Fandrich et al. |
| 5,530,705 A | 6/1996 | Malone |
| 5,537,555 A | 7/1996 | Landry |
| 5,551,003 A | 8/1996 | Mattson et al. |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |

(Continued)

FOREIGN PATENT DOCUMENTS

| | | |
|---|---|---|
| EP | 1 465 203 A1 | 10/2004 |
| EP | 1 990 921 A2 | 11/2008 |

(Continued)

OTHER PUBLICATIONS

International Search Report and Written Opinion dated Jul. 25, 2014, received in International Patent Application No. PCT/US2014/029453, which corresponds to U.S. Appl. No. 13/963,444, 9 pages (Frayer).

(Continued)

*Primary Examiner* — James G Norman
(74) *Attorney, Agent, or Firm* — Morgan, Lewis & Bockius LLP

(57) ABSTRACT

The embodiments described herein are used to execute staggered memory operations. The method includes, at each of a plurality of distinct memory portions of the storage device, establishing a non-zero command delay parameter distinct from a command delay parameter established for one or more of the other memory portions in the plurality of distinct memory portions. The method further includes, after establishing the non-zero command delay parameter in each of the plurality of distinct memory portions of the storage device, executing memory operations in two or more of the plurality of distinct memory portions of the storage device during overlapping time periods, the executing including, in each memory portion of the plurality of memory portions, delaying execution of a respective memory operation by an amount of time corresponding to the command delay parameter established for that memory portion.

26 Claims, 12 Drawing Sheets

(56) References Cited

U.S. PATENT DOCUMENTS

| | | |
|---|---|---|
| 5,943,692 A | 8/1999 | Marberg et al. |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,070,074 A | 5/2000 | Perahia et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh et al. |
| 6,311,263 B1 | 10/2001 | Barlow et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,871,257 B2 | 3/2005 | Conley et al. |
| 6,895,464 B2 | 5/2005 | Chow et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,100,002 B2 | 8/2006 | Shrader et al. |
| 7,111,293 B1 | 9/2006 | Hersh et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,571,277 B2 | 8/2009 | Mizushima |
| 7,574,554 B2 | 8/2009 | Tanaka et al. |
| 7,596,643 B2 | 9/2009 | Merry et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich |
| 7,996,642 B1 | 8/2011 | Smith |
| 8,006,161 B2 | 8/2011 | Lestable et al. |
| 8,032,724 B1 | 10/2011 | Smith |
| 8,042,011 B2 * | 10/2011 | Nicolaidis et al. ............ 714/718 |
| 8,069,390 B2 | 11/2011 | Lin |
| 8,190,967 B2 | 5/2012 | Hong et al. |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,438,459 B2 | 5/2013 | Cho et al. |
| 8,634,248 B1 | 1/2014 | Sprouse et al. |
| 2001/0050824 A1 | 12/2001 | Buch |
| 2002/0024846 A1 | 2/2002 | Kawahara et al. |
| 2002/0083299 A1 | 6/2002 | Van Huben et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid |
| 2003/0088805 A1 | 5/2003 | Majni et al. |
| 2003/0093628 A1 | 5/2003 | Matter et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0073829 A1 | 4/2004 | Olarig |
| 2004/0148561 A1 | 7/2004 | Shen et al. |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0039227 A1 * | 2/2006 | Lai et al. ............ 365/230.03 |
| 2006/0053246 A1 | 3/2006 | Lee |
| 2006/0085671 A1 | 4/2006 | Majni et al. |
| 2006/0087893 A1 | 4/2006 | Nishihara et al. |
| 2006/0107181 A1 | 5/2006 | Dave et al. |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0259528 A1 | 11/2006 | Dussud et al. |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0091677 A1 | 4/2007 | Lasser et al. |
| 2007/0113019 A1 | 5/2007 | Beukema |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0201274 A1 | 8/2007 | Yu et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0277036 A1 | 11/2007 | Chamberlain et al. |
| 2007/0279988 A1 * | 12/2007 | Nguyen ............ 365/185.18 |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0077841 A1 | 3/2008 | Gonzalez et al. |
| 2008/0077937 A1 | 3/2008 | Shin et al. |

(56) References Cited

U.S. PATENT DOCUMENTS

| | | |
|---|---|---|
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0037652 A1 | 2/2009 | Yu et al. |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0319864 A1 | 12/2009 | Shrader |
| 2010/0002506 A1 | 1/2010 | Cho et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0161936 A1 | 6/2010 | Royer et al. |
| 2010/0174959 A1 | 7/2010 | No et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2011/0051513 A1 | 3/2011 | Shen et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0173378 A1 | 7/2011 | Filor et al. |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2012/0096217 A1 | 4/2012 | Son et al. |
| 2012/0110250 A1 | 5/2012 | Sabbag et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0185750 A1 | 7/2012 | Hayami |
| 2012/0195126 A1 | 8/2012 | Roohparvar |
| 2012/0233391 A1 | 9/2012 | Frost et al. |
| 2012/0239976 A1 | 9/2012 | Cometti et al. |
| 2012/0284587 A1 | 11/2012 | Yu et al. |
| 2013/0031438 A1 | 1/2013 | Hu et al. |
| 2013/0036418 A1 | 2/2013 | Yadappanavar et al. |
| 2013/0176784 A1 | 7/2013 | Cometti et al. |
| 2013/0179646 A1 | 7/2013 | Okubo et al. |
| 2013/0343131 A1 | 12/2013 | Wu et al. |
| 2014/0063905 A1 | 3/2014 | Ahn et al. |
| 2014/0095775 A1 | 4/2014 | Talagala et al. |
| 2014/0122818 A1 | 5/2014 | Hayasaka et al. |
| 2014/0136927 A1 | 5/2014 | Li et al. |
| 2014/0143505 A1 | 5/2014 | Sim et al. |

FOREIGN PATENT DOCUMENTS

| | | |
|---|---|---|
| JP | 2002-532806 | 10/2002 |
| WO | WO 2007/036834 | 4/2007 |
| WO | WO 2007/080586 | 7/2007 |
| WO | WO 2008/121553 | 10/2008 |
| WO | WO 2008/121577 | 10/2008 |
| WO | WO 2009/028281 | 3/2009 |
| WO | WO 2009/032945 | 3/2009 |
| WO | WO 2009/058140 | 5/2009 |
| WO | WO 2009/084724 | 7/2009 |
| WO | WO 2009/134576 | 11/2009 |
| WO | WO 2011/024015 | 3/2011 |

OTHER PUBLICATIONS

Barr, Introduction to Watchdog Timers, Oct. 2001, 3 pgs.
Canim, Buffered Bloom liters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology—AT Attachment with Packet Interface Extension, Aug. 19, 1998, 339 pgs.
Park et al., "A High Performance Controller for NAND Flash-Based Solid State Disk (NSSD)," Proceedings of Non-Volatile Semiconductor Memory Workshop, Feb. 2006, 4 pgs.
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated May 14, 2014, received in International Patent Application No. PCT/US2014/017168, which corresponds to U.S. Appl. No. 14/076,115, 6 pages (Fitzpatrick).
International Search Report and Written Opinion dated May 14, 2014, received in International Patent Application No. PCT/US2014/017169, which corresponds to U.S. Appl. No. 14/076,148, 6 pages (Fitzpatrick).
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.

(56) References Cited

OTHER PUBLICATIONS

Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC; International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.

* cited by examiner (B)
↓

Adjust the value of a non-zero command delay parameter corresponding to a first distinct memory portion of the plurality of memory portions ~446

Reduce the value of a command delay parameter corresponding to a first distinct memory portion of the plurality of memory portions, to zero ~448

Change the value of a command delay parameter corresponding to a first distinct memory portion of the plurality of memory portions, to a new non-zero value ~450

(C)
↓

In an additional memory portion of the storage device, distinct from said plurality of memory portions of the storage device:

Execute memory operations during the overlapping time periods, without delaying execution of said memory operations in the additional memory portion of the storage device ~452

Establish a zero command delay parameter distinct from the command delay parameters established for said plurality of distinct memory portions, and executing memory operations in the additional memory portion of the storage device during the overlapping time periods in accordance with the zero command delay parameter ~454

Figure 4E

METHODS AND SYSTEMS FOR STAGGERED MEMORY OPERATIONS

RELATED APPLICATION

This application claims priority to U.S. Provisional Patent Application Ser. No. 62/005,920, filed May 30, 2014, entitled "Methods and Systems for Staggered Memory Operations," which is herein incorporated by reference in its entirety.

TECHNICAL FIELD

The disclosed embodiments relate generally to memory systems, and in particular, to executing staggered memory operations on one or more portions of memory.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

As the number of memory operations that can be performed concurrently within a storage device increases, the number and size of the current spikes drawn by the storage device also increase. These current spikes can exceed the power supply capability of the storage device's power supply, even when the average amount of current drawn falls well within the power supply capability of the storage device's power supply. Furthermore, these current spikes result in uneven power signatures, and in some cases wasted power and increased wear on components of a semiconductor memory device.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to execute staggered memory operations on one or more portions of memory.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 4A-4E illustrate a flowchart representation of a method of executing staggered memory operations on one or more portions of memory, in accordance with some embodiments.

Figure 1A:
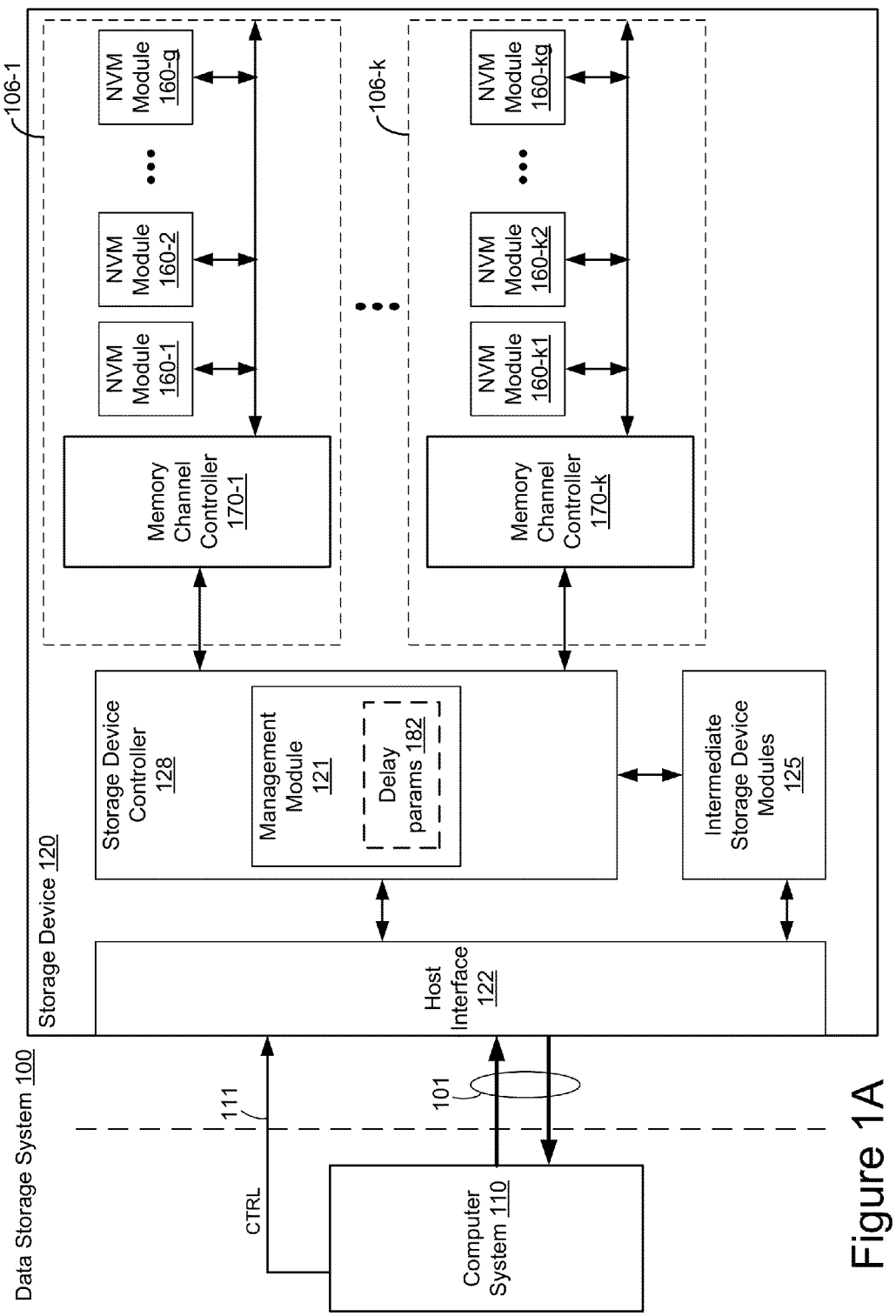
FIG. 1A is a block diagram illustrating a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to manage current spikes observed when parallel memory operations are performed. Some implementations include systems, methods and/or devices to execute staggered memory operations.

The memory storage needs for electronic devices ranging from smart phones to server systems are rapidly growing. For example, as enterprise applications mature, the capacity of storage devices required for these applications has dramatically increased. As the capacity has increased, correspondingly, the number of non-volatile memory chips inside the storage devices has also increased. As a result of the number of memory chips increasing, the centralized hardware resources inside these storage devices are under higher demand to manage the current spikes experienced by the storage device, caused by parallel memory operations.

In order to effectively manage the current spikes, due to parallel memory operations in storage devices, some implementations described herein use scalable techniques to execute memory operations with staggered delays across multiple non-volatile memory (NVM) modules, where each NVM module includes multiple NVM devices. For example, memory operations executed by non-volatile memory devices (sometimes called memory chips or NVM die) in different memory channels of a storage device are executed with different delay times so as to spread out the current spikes associated with those memory operations.

In some embodiments, a storage device includes multiple NVM modules in each of a plurality of memory channels, and each NVM module includes a processor (e.g., an ASIC) herein called an NVM controller, and multiple NVM devices whose operation is at least controlled by the NVM controller. Each NVM module includes memory, either volatile or non-volatile, for storing device configuration parameters, including one or more delay values. As an example of one of its functions, the NVM controller delays execution of memory operations by the NVM devices in the NVM module in accordance with delay values provided by a storage controller of the storage device, or provided by a host computer system. By providing different delay values to different NVM modules, parallel memory operations performed in the different NVM modules begin execution at staggered start times, which reduces current spikes due to parallel performance of memory operations in the different NVM modules.

More specifically, in some embodiments, a method performed in a storage device includes, at each of a plurality of distinct memory portions of the storage device, establishing a non-zero command delay parameter distinct from a command delay parameter established for one or more of the other memory portions in the plurality of distinct memory portions. The method includes after establishing the non-zero command delay parameter in each of the plurality of distinct memory portions of the storage device, executing memory operations in two or more of the plurality of distinct memory portions of the storage device during overlapping time periods, the executing including, in each memory portion of the plurality of memory portions, delaying execution of a respective memory operation by an amount of time corresponding to the command delay parameter established for that memory portion.

In some embodiments, the plurality of memory portions comprises non-volatile memory portions. In some embodiments, the plurality of memory portions comprises NAND flash memory portions. For example, in some implementations the plurality of memory portions are the memory portions of a storage device located in distinct NVM modules, with each NVM module comprising a distinct memory portion. In another example, the plurality of memory portions are the memory portions of a storage device located in distinct memory channels, with the NVM devices in each memory channel comprising a distinct memory portion.

In some embodiments, the executed memory operations, executed in the two or more of the plurality of distinct memory portions of the storage device, are write operations. In some embodiments, the command delay parameter for each of the two or more of the plurality of distinct memory portions of the storage device is a write delay parameter for controlling delay of write operations. In some embodiments, the value of at least one write delay parameter is less than or equal to the average duration of time for a write operation.

In some embodiments, the executed memory operations, executed in the two or more of the plurality of distinct memory portions of the storage device, are erase operations. In some embodiments, the command delay parameter for each of the two or more of the plurality of distinct memory portions of the storage device is an erase delay parameter for controlling delay of erase operations. In some embodiments, the value of at least one erase delay parameter is less than or equal to the average duration of time for an erase operation.

In some embodiments, the executed memory operations, executed in the two or more of the plurality of distinct memory portions of the storage device, are read operations. In some embodiments, the command delay parameter for each of the two or more of the plurality of distinct memory portions of the storage device is a read delay parameter for controlling delay of read operations. In some embodiments, the value of at least one read delay parameter is less than or equal to the average duration of time for a read operation.

In some embodiments, the method includes, while executing a sequence of memory operations in a single memory portion of the plurality of distinct memory portions of the storage device, delaying a first memory operation of the sequence of memory operations in accordance with the command delay parameter established for that single memory portion, and thereafter executing each subsequent memory operation in the sequence of memory operations in sequential order without further delaying each said subsequent memory operation in the sequence of memory operations. In some embodiments, the method includes detecting the presence of the sequence of memory operations in a work queue associated with the single memory portion.

In some embodiments, the method includes, while executing memory write operations in a work queue associated with a first subset of the plurality of distinct memory portions of the storage device, executing a first subset of the memory write operations in the work queue in parallel, with execution of those operations delayed by the amount of time corresponding to the command delay parameter established for each memory portion to which write data is written by the first subset of the memory write operations in the work queue. In some embodiments, the method further includes thereafter executing each subsequent memory write operation in the work queue without further delaying each said subsequent memory write operation.

In some embodiments, the method includes, in an additional memory portion of the storage device, distinct from said plurality of memory portions of the storage device, executing memory operations during the overlapping time periods, without delaying execution of said memory operations in the additional memory portion of the storage device.

In some embodiments, the method further comprises, at an additional memory portion of the storage device, distinct from said plurality of memory portions of the storage device, establishing a zero command delay parameter distinct from the command delay parameters established for said plurality of distinct memory portions, and executing memory operations in the additional memory portion of the storage device during the overlapping time periods in accordance with the zero command delay parameter.

In some embodiments, the method further includes, at each of the plurality of distinct memory portions of the storage device, establishing two or more non-zero command delay parameters distinct from command delay parameters established for one or more of the other memory portions in the plurality of distinct memory portions, where the two or more non-zero command delay parameters include at least a first command delay parameter for use when executing a first command type selected from the set consisting of read, write and erase commands and a second command delay parameter for use when executing a second command type distinct from the first command types and selected from the set consisting of read, write and erase commands.

In some embodiments, the method further includes adjusting the value of a non-zero command delay parameter corresponding to a first distinct memory portion of the plurality of memory portions. In some embodiments, adjusting the value of a non-zero command delay parameter corresponding to a first distinct memory portion of the plurality of memory portions comprises reducing the value of a command delay parameter corresponding to a first distinct memory portion of the plurality of memory portions, to zero. In some embodiments, adjusting the value of a non-zero command delay parameter corresponding to a first distinct memory portion of the plurality of memory portions comprises changing the value of a command delay parameter corresponding to a first distinct memory portion of the plurality of memory portions, to a new non-zero value.

In some embodiments, the storage device comprises one or more three-dimensional (3D) memory devices and circuitry associated with operation of memory elements in the one or more 3D memory devices.

In some embodiments, the circuitry and one or more memory elements in a respective 3D memory device, of the one or more 3D memory devices, are on the same substrate.

In some embodiments, the storage device comprises one or more flash memory devices.

In some embodiments, one or more of the command-delay parameters is stored in non-volatile memory.

In some embodiments, the storage device includes a plurality of controllers.

In some embodiments, the plurality of controllers on the storage device includes a memory controller and one or more flash controllers, the one or more flash controllers coupled by the memory controller to a host interface of the storage device.

In some embodiments, the plurality of controllers on the storage device includes at least one non-volatile memory (NVM) controller and at least one other memory controller other than the at least one NVM controller.

In some embodiments, the storage device includes a dual in-line memory module (DIMM) device.

In some embodiments, one of the plurality of controllers on the storage device maps double data rate (DDR) interface commands to serial advance technology attachment (SATA) interface commands.

In another aspect, any of the methods described above are performed by a storage device that includes (1) an interface for coupling the storage device to a host system, (2) non-volatile memory, including multiple distinct memory portions of the non-volatile memory, and (3) a set of one or more storage controllers, having one or more processors, the set of one or more storage controllers configured to: (A) at each of a plurality of distinct memory portions of the storage device, establish a non-zero command delay parameter distinct from a command delay parameter established for one or more of the other memory portions in the plurality of distinct memory portions, and (B) after establishing the non-zero command delay parameter in each of the plurality of distinct memory portions, execute memory operations in two or more of the plurality of distinct memory portions during overlapping time periods, the executing including, in each memory portion of the plurality of memory portions, delaying execution of a respective memory operation by an amount of time corresponding to the command delay parameter established for that memory portion.

In yet another aspect, any of the methods described above are performed by a storage device that includes means for coupling the storage device to a host system; non-volatile memory means, including multiple distinct memory portions; and controller means configured to: establish, at each of a plurality of the distinct memory portions, a non-zero command delay parameter distinct from a command delay parameter established for one or more of the other memory portions in the plurality of distinct memory portions; and execute memory operations, after establishing the non-zero command delay parameter in each of the plurality of distinct memory portions, in two or more of the plurality of distinct memory portions during overlapping time periods, the executing including, in each memory portion of the plurality of memory portions, delaying execution of a respective memory operation by an amount of time corresponding to the command delay parameter established for that memory portion.

In some embodiments, the storage device is configured to perform any of the methods described above.

In yet another aspect, a non-transitory computer readable storage medium stores one or more programs for execution by one or more processors of a storage device, the one or more programs including instructions for performing any one of the methods described above.

In some embodiments, the storage device includes a plurality of controllers, and the non-transitory computer readable storage medium includes a non-transitory computer readable storage medium for each controller of the plurality of controllers, each having one or more programs including instructions for performing any of the methods described above, or respective portions of any of the methods described above.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

FIG. 1A is a block diagram illustrating a data storage system 100, in accordance with some embodiments. While some example features are illustrated, various other features have not been illustrated for the sake of brevity and so as not to obscure more pertinent aspects of the example embodiments disclosed herein. To that end, as a non-limiting example, data storage system 100 includes storage device 120, which includes host interface 122, storage device controller 128, and memory channels 106. Each memory channel 106 includes a memory channel controller 170 and one or more NVM modules 160. Optionally, data storage system 100 also includes intermediate modules 125, as discussed below.

In this non-limiting example, data storage system 100 is used in conjunction with computer system 110. Computer system 110 is coupled to storage device 120 through data connections 101. However, in some embodiments computer system 110 includes storage device 120 as a component and/or sub-system. Computer system 110 may be any suitable computer device, such as a personal computer, a workstation, a computer server, or any other computing device. Computer system 110 is sometimes called a host or host system. In some embodiments, computer system 110 includes one or more processors, one or more types of memory, optionally includes a display and/or other user interface components such as a keyboard, a touch screen display, a mouse, a track-pad, a digital camera and/or any number of supplemental devices to add functionality. Further, in some embodiments, computer system 110 sends one or more host commands (e.g., read commands and/or write commands) on control line 111 to storage device 120. In some embodiments, computer system 110 is a server system, such as a server system in a data center, and does not have a display, keyboard, mouse or other user interface components.

In some embodiments, storage device 120 includes intermediate modules 125, which include one or more processing units (also sometimes called CPUs or processors or microprocessors or microcontrollers) configured to execute instructions in one or more programs. Intermediate modules 125 are coupled to host interface 122 and storage device controller 128, in order to coordinate the operation of these components, including supervising and controlling functions such as one or more of: power up and power down, data hardening, charging energy storage device(s), data logging, communicating between modules on storage device 120, endurance management, RAID management, compression, error correction encoding/decoding, encryption, power failure recovery, wear leveling and/or other aspects of managing functions on storage device 120.

Storage device 120 can be configured for enterprise storage suitable for applications such as cloud computing, or for caching data stored (or to be stored) in secondary storage, such as hard disk drives. Additionally and/or alternatively, storage device 120 can also be configured for relatively smaller-scale applications such as personal flash drives or hard-disk replacements for personal, laptop and tablet computers. Although flash memory devices and flash controllers are used as an example here, storage device 120 (FIG. 1A) may include any other NVM device(s) and corresponding NVM module controller(s).

Storage device controller 128 is coupled to host interface 122 (e.g., directly or via intermediate storage device modules 125), and memory channel controllers 170. Non-volatile memory (NVM) module(s) 160 are coupled with the storage device controller 128 via one or more channel(s) 106 (e.g., channel 106-1 through 106-k). In some embodiments, as depicted in FIG. 1A, each respective channel 106 supports one or more NVM modules 160 and is coupled with a respective memory channel controller 170, which in turn is coupled to storage device controller 128. In some embodiments, storage device controller 128 is or includes a solid-state drive (SSD) controller. In some embodiments, memory channel controllers 170 reside within storage device controller 128. Further, in some embodiments, the memory channel controllers 170 are or include solid-state drive (SSD) controllers.

In some embodiments, each respective channel 106 supports one or more NVM modules 160 that are coupled directly with storage device controller 128, and some such embodiments do not include memory channel controllers 170.

In some embodiments, each NVM controller of NVM controllers 170 includes one or more processing units (sometimes called CPUs or processors or microprocessors or microcontrollers) configured to execute instructions in one or more programs. Channels 106 that couple memory channel controllers 170 and NVM modules 160 are connections that typically convey commands in addition to data, and, optionally, convey metadata, error correction information and/or other information in addition to data values to be stored in non-volatile memory within one or more NVM modules 160 and data values read from non-volatile memory within one or more NVM modules 160. In some embodiments, each respective channel 106 includes one or more data buses (e.g., eight data buses). In some embodiments, storage device controller 128 is coupled with a single NVM module 160 (e.g., via a single channel 106) while in other embodiments storage device controller 128 is coupled with a plurality of NVM modules 160 (e.g., via one or more channels 106).

In some embodiments, during a write operation, storage device controller 128 receives data from computer system 110 through host interface 122 and during a read operation, storage device controller 128 sends data to computer system 110 through host interface 122. Further, host interface 122 provides additional data, signals, voltages, and/or other information needed for communication between storage device controller 128 and computer system 110. In some embodiments, storage device controller 128 and host interface 122 use a defined interface standard for communication, such as double data rate type three synchronous dynamic random access memory (DDR3). In some embodiments, the defined interface standard for communication used by storage device controller 128 and host interface 122 is serial advance technology attachment (SATA). In some other implementations, the defined interface standard for communication used by storage device controller 128 and host interface 122 is SAS (serial attached SCSI), or other storage interface.

In some embodiments, storage device controller 128 includes one or more processing units (also sometimes called CPUs or processors or microprocessors or microcontrollers) configured to execute instructions in one or more programs (e.g., in storage device controller 128).

In some embodiments, storage device controller 128 receives host commands from computer system 110, via host interface 122, to perform one or more memory operations on one or more portions of non-volatile memory within storage device 120. For example, storage device controller 128 receives host commands to perform read, write, erase, read-modify-write or other memory programming operations.

In some embodiments, storage device controller 128 includes a management module 121 that translates the logical addresses in received host commands to physical addresses in the storage device 120, and then conveys memory commands corresponding to the received host commands to the respective memory channels 106 in accordance with the physical addresses. Typically, each memory channel has an assigned range of physical addresses that is distinct from the physical addresses assigned to the other memory channels.

In some embodiments, the NVM controllers in the NVM modules delay sending commands to perform memory operations to the NVM devices within those NVM modules, in accordance with command-delay parameters 182 distributed by storage device controller 128 to the NVM modules 160. In some embodiments, delay parameters 182 are stored in non-volatile memory, and in some embodiments delay parameters 182 are stored in volatile memory.

In some embodiments, storage device controller 128 receives one or more host commands via host interface 122 to establish or update command-delay parameters 182 residing within storage device controller 128, or residing within one or more NVM modules 160. In some embodiments, command-delay parameters 182 include all the various command-delay parameters assigned to NVM modules 160, or portions of non-volatile memory within NVM modules 160. In some embodiments, algorithms, code or programming to enable executing staggered memory operations using delay parameters, are loaded or updated by storage device controller 128. In some embodiments this loading or updating occurs during firmware initialization, during power up, during idle operation of the storage device or during normal operation of the storage device.

Figure 1B:
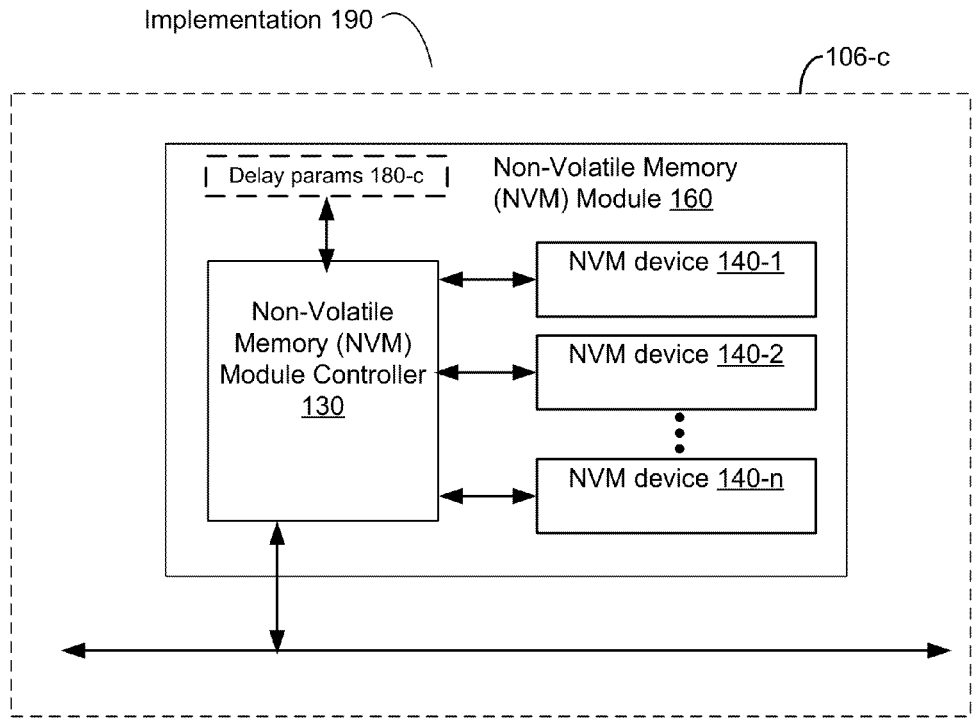
FIGS. 1B and 1C are block diagrams illustrating two implementations of a non-volatile memory module, in accordance with some embodiments.
Figure 1C:
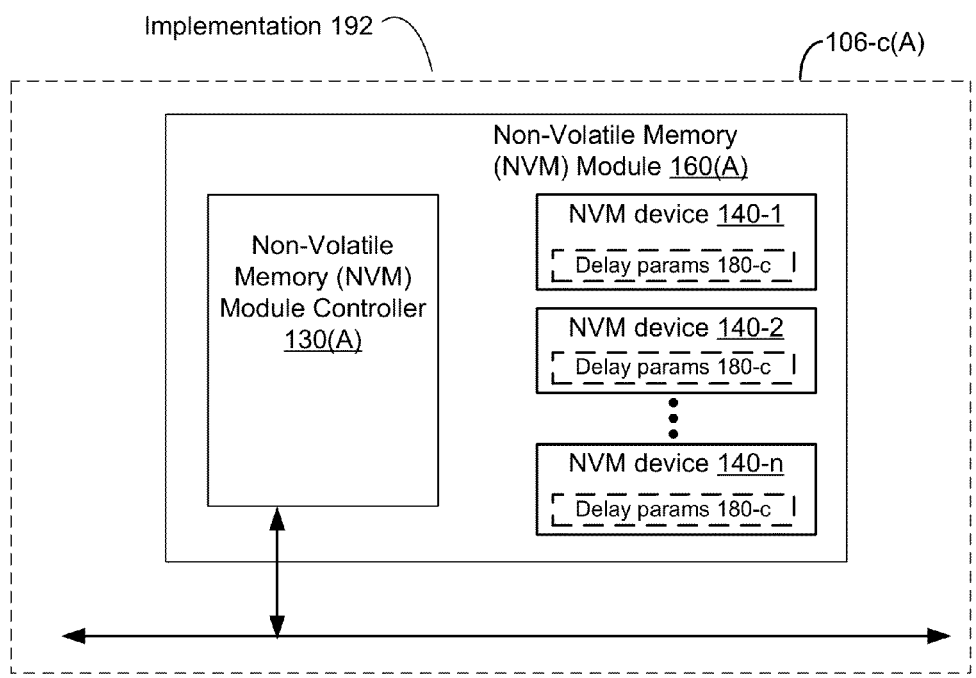

In some embodiments, storage device controller 128 executes commands to establish or update command-delay parameters stored at NVM modules 160, or stored at NVM devices 140 (e.g., as shown in FIG. 1C), depending on the implementation. In some implementations these commands are called "trim" commands or "configuration setting" commands, used to set internal or configuration parameters in the NVM controllers 130 and/or the device NVM devices 140. In some other embodiments, storage device controller 128 executes commands to distribute the command delay parameters for each memory channel to the corresponding memory channel controller 170, and the memory channel controllers 170 execute commands (e.g., the aforementioned "trim" commands or "configuration setting" commands) to establish or update command-delay parameters stored at NVM modules 160, or stored at NVM devices 140 (e.g., as shown in FIG. 1C), depending on the implementation. Generally, the same delay parameter distribution mechanism used to initially establish command-delay parameters in the different channels of storage device 120 (or more generally in different subsets of the NVM modules 160 of storage device 120, or in different subsets of the NVM devices 140 of storage device 120) is also used to update the command-delay parameters in the different channels of storage device 120 (or more generally in different subsets of the NVM modules 160 of storage device 120, or in different subsets of the NVM devices 140 of storage device 120).

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, mean the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1" and otherwise the raw data value is a "0."

FIGS. 1B and 1C are block diagrams illustrating two implementations 190 and 192, of a non-volatile memory (NVM) module 160 and 160(A), respectively, in accordance with some embodiments. For purposes of this explanation, the NVM module is located in memory channel c, which can be any of the memory channels of the storage device 120, and the delay parameters 180-c are the delay parameters assigned to devices in memory channel c. However, other embodiments with other patterns of assigning delay parameters are described below.

In some embodiments, each NVM module 160 includes one or more NVM module controllers (e.g., NVM module controller(s) 130), and one or more NVM devices 140 (e.g., one or more flash memory die). In some embodiments, a respective NVM device 140 is a single die, while in other embodiments a respective NVM device includes more than one die. Typically NVM module 160 includes a plurality of NVM devices 140, but in some implementations includes a single NVM device (e.g., a high density 3D flash memory die). In some embodiments, NVM devices 140 include NAND-type flash memory or NOR-type flash memory.

In some embodiments, an NVM module 160 receives one or more host commands to perform one or more memory operations on one or more portions of non-volatile memory in NVM module 160 (e.g., to perform three read operations on three distinct die). In some embodiments, NVM module 160, determines to which respective NVM device 140 to send a respective memory operation. In some embodiments, this determination is made by the one or more NVM module controllers 130. In some embodiments, an NVM module controller 130 delays sending one or more commands to perform memory operations on a respective NVM device 140, in accordance with command-delay parameters 180-c stored in NVM module 160, as shown in implementation 190 (FIG. 1B). In some embodiments, command-delay parameters 180-c are stored in non-volatile memory, and in some embodiments command-delay parameters 180 are stored in volatile memory.

In some embodiments, the NVM modules 160 each include cache memory, memory registers and/or volatile memory (e.g., implemented using SRAM or DRAM). In some embodiments, each NVM module 160 stores a set of command-delay parameters 180-c in the cache memory, registers or volatile memory of the NVM module 160. In some embodiments, each time storage device 120 is powered on, or reset, command-delay parameters 180-c are re-established in the NVM module 160 through an initialization or power-on process performed by storage device controller 128. Alternatively, the NVM module 160 transfers data, including command-delay parameters 180-c, in cache memory, registers and/or volatile memory to non-volatile memory (e.g., in one or more of the NVM devices in the NVM module 160) upon detection of a power fail condition or shut-down, and restores that data, including command-delay parameters 180-c, to the cache memory, registers or volatile memory upon power-up or restoration of power. In another alternative, command-delay parameters 180-c are stored in non-volatile memory, such as NOR flash memory, or NAND flash memory configured to operate in a single-layer-cell (SLC) mode of operation to facilitate fast storage, retrieval and updating (if applicable).

Implementation 192 shows that in some embodiments, command-delay parameters 180-c assigned to the memory devices in memory channel c are stored in NVM devices 140. In such implementations, NVM devices 160 include a controller or state machine (not shown) that delays execution of one or more memory operations in accordance with the command-delay parameters 180-c stored in those devices. Furthermore, in such implementations, NVM module controller 130(A) either does not store command-delay parameters 180-c or does delay issuance of memory operation commands to the NVM devices in accordance with command-delay parameters 180-c.

By storing different command-delay parameters 180-c in the NVM devices 140 or NVM module controllers 130 in different memory channels (or more generally in different subsets of the NVM modules 160 of storage device 120, or in different subsets of the NVM devices 140 of storage device 120), the performance of memory operations that would otherwise be performed in parallel with virtually identical start times are staggered, thereby reducing current spikes caused by the parallel execution of memory commands in different memory channels (or more generally in different subsets of the NVM modules 160 of storage device 120, or in different subsets of the NVM devices 140 of storage device 120).

In some embodiments, the command-delay parameters 180 assigned to a particular NVM module 160 or NVM device 140 include three delay parameters: a read delay parameter that specifies an amount of delay to be used when executing read operations, a write delay parameter that specifies an amount of delay to be used when executing write operations, and an erase delay parameter that specifies an amount of delay to be used when executing erase operations. These three delay parameters typically have different values due to the different timing characteristics of these three types of memory operations, and are selected so as to smooth out the current drawn by the storage device 120, as a whole, while performing memory operations of each type in parallel in different memory channels (or more generally in different subsets of the NVM modules 160 of storage device 120, or in different subsets of the NVM devices 140 of storage device 120).

In some embodiments, each NVM device 140 is divided into a number of addressable and individually selectable blocks. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, each block includes a predefined number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of each NVM device 140.

Figure 1D:
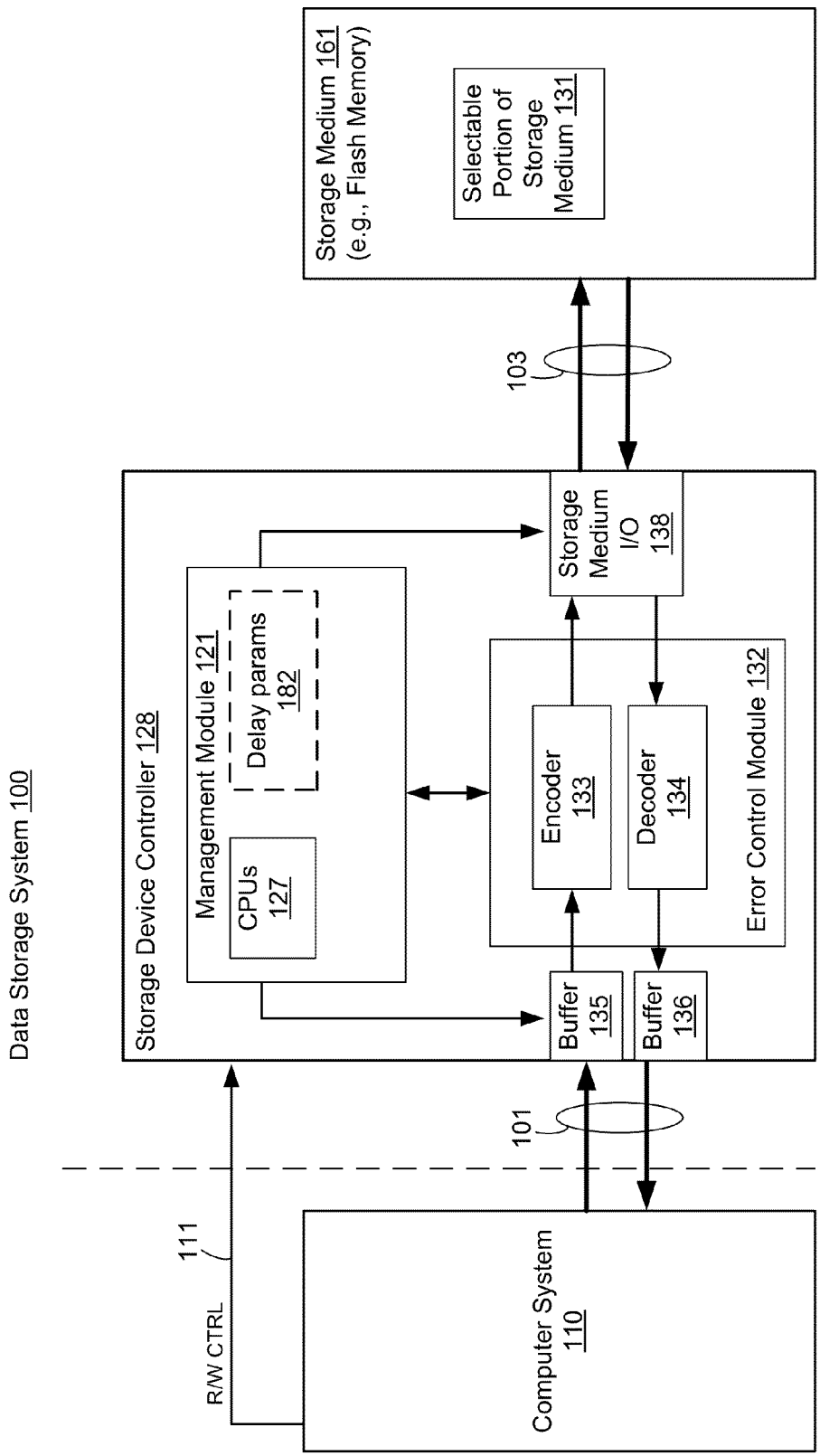
FIG. 1D is a block diagram of a data storage system, in accordance with some embodiments.

FIG. 1D illustrates a portion of data storage system 100, in accordance with some embodiments. While some example features are illustrated, various other features have not been illustrated for the sake of brevity and so as not to obscure more pertinent aspects of the example implementations disclosed herein. To that end, as a non-limiting example, the data storage system 100 includes a storage device controller 128, and a storage medium 161, and is used in conjunction with a computer system 110.

Features and functions of storage system 100, computer system 110 and storage device controller 128 already described above with reference to FIG. 1A are not repeated here.

Storage medium 161 is coupled to storage device controller 128 through connections 103. Connections 103 are sometimes called data connections, but typically convey commands in addition to data, and optionally convey metadata, error correction information and/or other information in addition to data values to be stored in storage medium 161 and data values read from storage medium 161. In some implementations, however, storage device controller 128 and storage medium 161 are included in the same device as components thereof. Additional features and functions of storage medium 161, including selectable portions such as selectable portion 131, are described above with respect to NVM devices 140, in the discussion of FIG. 1B.

In some implementations, storage device controller 128 includes a management module 121, an input buffer 135, an output buffer 136, an error control module 132 and a storage medium interface (I/O) 138. Storage device controller 128 may include various additional features that have not been illustrated for the sake of brevity and so as not to obscure more pertinent features of the example implementations disclosed herein, and a different arrangement of features may be possible. Input and output buffers 135,136 provide an interface to computer system 110 through data connections 101. Similarly, storage medium I/O 138 provides an interface to storage medium 161 though connections 103. In some implementations, storage medium I/O 138 includes read and write circuitry, including circuitry capable of conveying command-delay parameters to storage medium 161 (e.g., establishing or updating command-delay parameters 180-c, shown in FIGS. 1B and 1C).

In some implementations, management module 121 includes one or more processing units (CPUs, also sometimes called processors) 127 configured to execute instructions in one or more programs (e.g., in management module 121). In some implementations, the one or more CPUs 127 are shared by one or more components within, and in some cases, beyond the function of storage device controller 128. Management module 121 is coupled to input buffer 135, output buffer 136 (connection not shown), error control module 132 and storage medium I/O 138 in order to coordinate the operation of these components. In some embodiments, the management module 121 includes a set of delay parameters 182, as described earlier with respect to FIG. 1A.

Error control module 132 is coupled to storage medium I/O 138, input buffer 135 and output buffer 136. Error control module 132 is provided to limit the number of uncorrectable errors inadvertently introduced into data. In some embodiments, error control module 132 includes an encoder 133 and a decoder 134. Encoder 133 encodes data by applying an error control code to produce a codeword, which is subsequently stored in storage medium 161. In some embodiments, when the encoded data (e.g., one or more codewords) is read from storage medium 161, decoder 134 applies a decoding process to the encoded data to recover the data, and to correct errors in the recovered data within the error correcting capability of the error control code. If the decoding is successful, the decoded data is provided to output buffer 136, where the decoded data is made available to computer system 110. In some implementations, if the decoding is not successful, storage device controller 128 may resort to a number of remedial actions or provide an indication of an irresolvable error condition. For the sake of brevity, an exhaustive description of the various types of encoding and decoding algorithms generally available and known to those skilled in the art is not provided herein.

In some implementations, management module 121 includes one or more procedures for distributing different sets of command-delay parameters to the NVM modules or NVM devices in different portions (e.g., different memory channels) of storage medium 161, as described above.

In some embodiments, management module 121 detects operating conditions in which current spikes are likely to occur, such as bursts of memory operations commands from host system 110 or from an internal process such as a garbage collection process, and responds to the detection of such conditions by conveying delay parameter values in or along with, memory operation commands conveyed to storage medium 161. The values of the delay parameters are determined by a predefined command-delay distribution scheme or pattern, such as different delays for different memory channels, or for different groups of NVM modules, or for different groups of NVM devices. NVM modules, or NVM devices, that receive the memory operation commands that include, or are accompanied by, non-zero delay parameter values delay execution of those memory operation commands in accordance with the received non-zero delay parameter values. In such implementations, NVM modules 160 and/or NVM devices 140 need not be configured with different sets of command-delay parameters, since the command-delay parameters are conveyed along with memory operation commands when operating conditions in the storage device 120 warrant the use of staggered command execution delays to avoid current spikes.

Figure 2A:
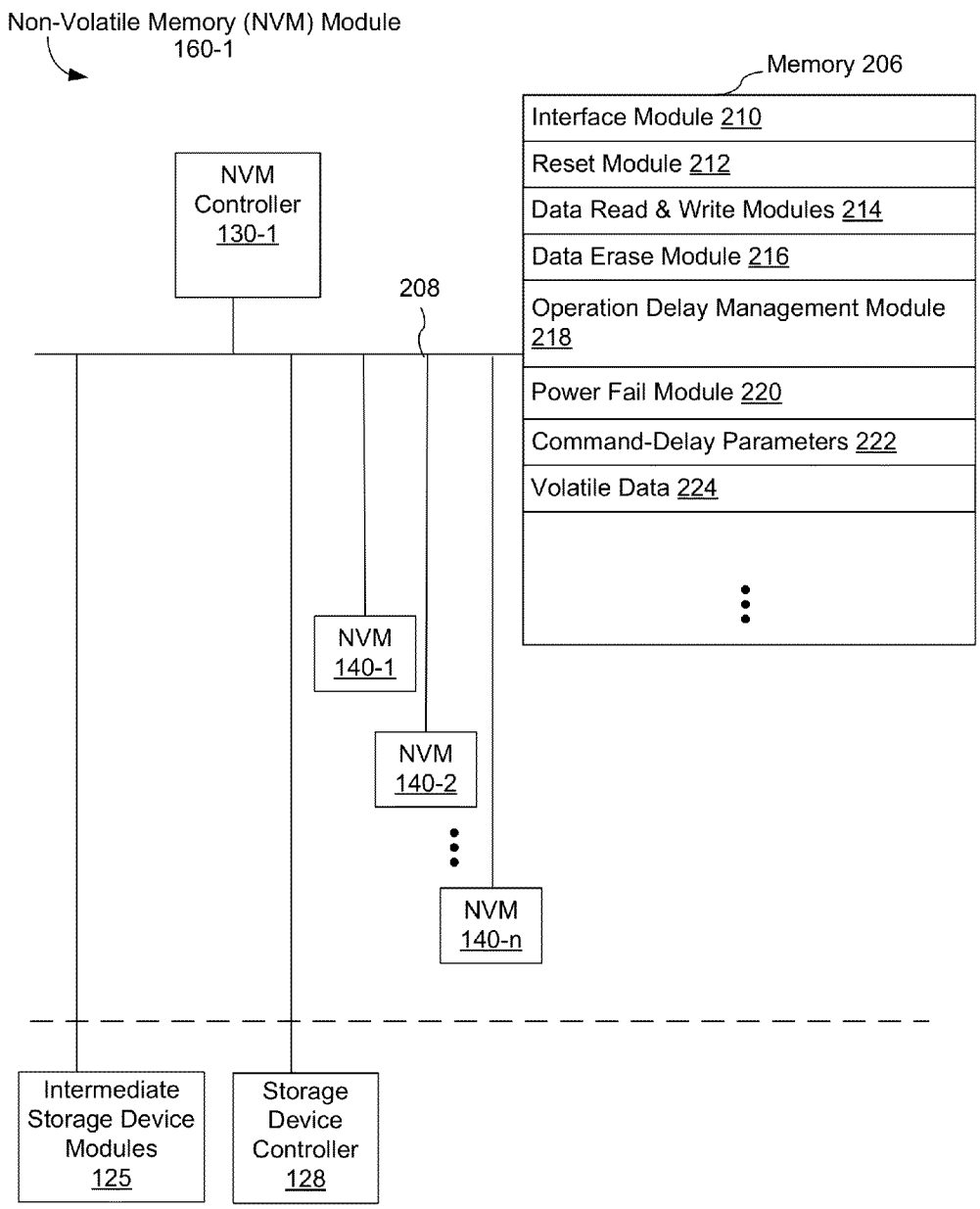
FIG. 2A is a block diagram illustrating a non-volatile memory module, in accordance with some embodiments.

FIG. 2A is a block diagram illustrating an NVM module 160-1, in accordance with some embodiments. NVM module 160-1 typically includes one or more processors (also sometimes called CPUs or processing units or microprocessors or microcontrollers, or controllers such as NVM controller 130-1) for executing modules, programs and/or instructions stored in memory 206 and thereby performing processing operations, memory 206, and one or more communication buses 208 for interconnecting these components. While NVM module 160-1 typically includes a single NVM controller 130-1, in some embodiments NVM module 160-1 includes a plurality of NVM controllers. Similarly, NVM controller 130-1 typically includes a single processor for executing instructions in one or more programs, but in some embodiments, NVM controller 130-1 comprises two or more processors.

Communication buses 208 optionally include circuitry (sometimes called a chipset) that interconnects and controls communications between system components. In some embodiments, NVM module 160-1 is coupled to storage device controller 128, intermediate storage device modules 125 (if present) and NVM devices 140 (e.g., NVM devices 140-1 through 140-n) by communication buses 208. In some embodiments, communication buses 208 convey commands in addition to data, and optionally convey metadata, error correction information and/or other information in addition to data values to be stored in NVM devices 140 and data values read from NVM devices 140.

Memory 206 includes high-speed random access memory, such as DRAM, SRAM, DDR RAM or other random access solid state memory devices, and may include NVM, such as one or more flash memory devices, other non-volatile solid state storage devices, magnetic disk storage devices, or optical disk storage devices. Memory 206 optionally includes one or more storage devices shared with other NVM modules or shared with storage device controller 128. Memory 206, or alternately the NVM device(s) within memory 206, comprises a non-transitory computer readable storage medium. In some embodiments, memory 206, or the computer readable storage medium of memory 206 stores the following programs, modules, and data structures, or a subset thereof:

- interface module 210 that is used for communicating with other components, such as storage device controller 128, error control module 132, and NVM devices 140;
- reset module 212 that is used for resetting NVM module 160-1;
- one or more data read and write modules 214 used for reading from and writing to NVM devices 140;
- data erase module 216 that is used for erasing portions of memory on NVM devices 140;
- operation delay management module 218 that is used for managing the application of one or more command-delay parameters to memory operations performed on NVM devices 140;
- power failure module 220 that is used for detecting a power failure condition on the storage device (e.g., storage device 120, FIG. 1A) and triggering storage of data in volatile memory to NVM;
- command-delay parameters 222 that are used in association with operation delay management module 218 to delay performance of one or more memory operations on NVM devices 140; and
- volatile data 224 including volatile data associated with NVM module 160-1, and in some embodiments information such as one or more of: health information for NVM devices 140 or portions thereof, memory operation parameters, a log of recently performed operations, etc.

In some embodiments, the operation delay management module 218 includes instructions for delaying the performance of memory operations on NVM devices 140 in the NVM module 160. In some embodiments, these instructions indicate how to delay the performance of memory operations, according to the methods described in FIGS. 4A-4E. In some embodiments, operation delay management module 218 retrieves command-delay parameters 222 to perform the above identified operations.

Each of the above identified elements may be stored in one or more of the previously mentioned storage devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, include instructions for implementing respective operations in the methods described below with reference to FIGS. 4A-4E.

Although FIG. 2A shows NVM module 160-1 in accordance with some embodiments, FIG. 2A is intended more as a functional description of the various features which may be present in an NVM module than as a structural schematic of the embodiments described herein. In practice, and as recognized by those of ordinary skill in the art, items shown separately could be combined and some items could be separated. Further, although FIG. 2A shows NVM module 160-1, the description of FIG. 2A similarly applies to other NVM modules (e.g., NVM module 160-m) in storage device 120 (FIG. 1A).

Figure 2B:
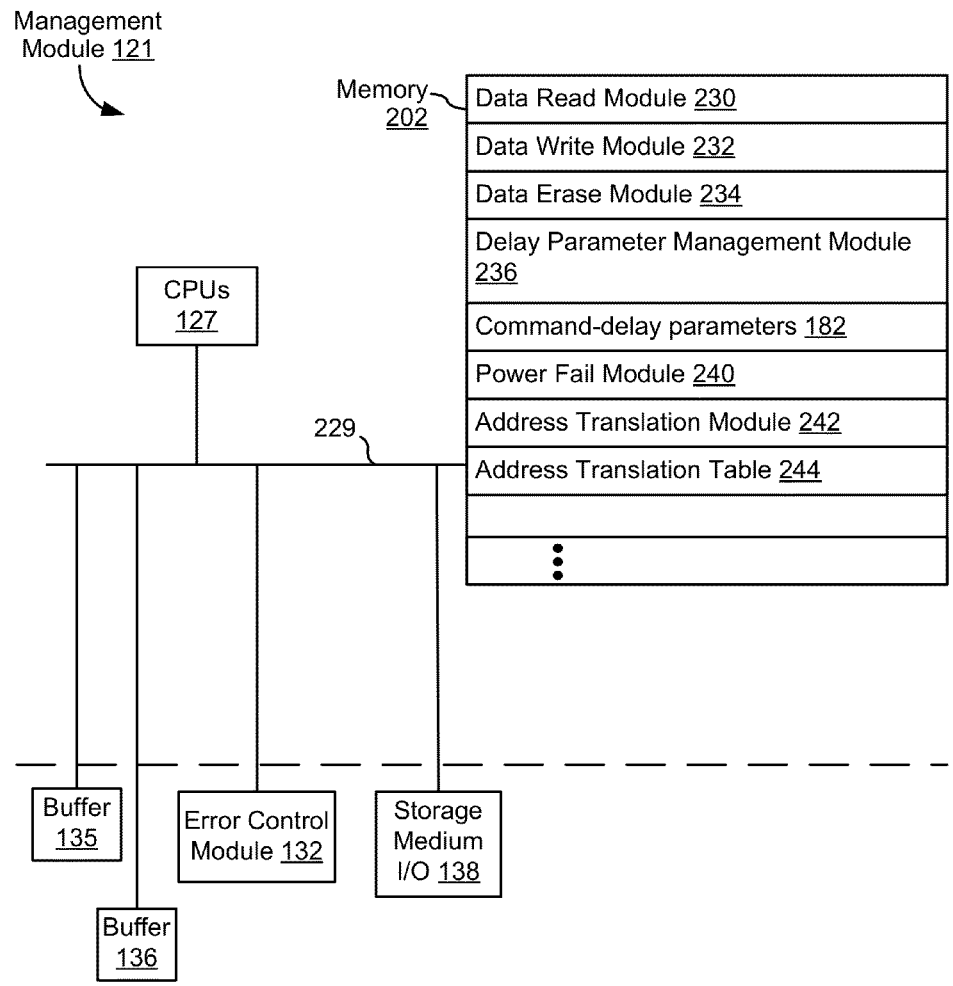
FIG. 2B is a block diagram illustrating a management module of a storage device controller, in accordance with some embodiments.

FIG. 2B is a block diagram illustrating an exemplary management module 121 in accordance with some embodiments. Management module 121 typically includes: one or more processing units (CPUs) 127 for executing modules, programs and/or instructions stored in memory 202 and thereby performing processing operations; memory 202; and one or more communication buses 229 for interconnecting these components. One or more communication buses 229, optionally, include circuitry (sometimes called a chipset) that interconnects and controls communications between system components. Management module 121 is coupled to buffer 135, buffer 136, error control module 132, and storage medium I/O 138 by one or more communication buses 229. Memory 202 includes high-speed random access memory, such as DRAM, SRAM, DDR RAM or other random access solid state memory devices, and may include non-volatile memory, such as one or more flash memory devices, other non-volatile solid state storage devices, magnetic disk storage devices, or optical disk storage devices. Memory 202 optionally includes one or more storage devices shared with one or more NVM modules 160 in storage medium 138. Memory 202, or alternatively the non-volatile memory device(s) within memory 202, comprises a non-transitory computer readable storage medium. In some embodiments, memory 202, or the non-transitory computer readable storage medium of memory 202, stores the following programs, modules, and data structures, or a subset or superset thereof:

- data read module 230 for reading data from storage medium 161 (FIG. 1D) comprising flash memory (e.g., one or more flash memory devices, such as NVM devices 140, each comprising a plurality of die);
- data write module 232 for writing data to storage medium 161;
- data erase module 234 for erasing data from storage medium 161;
- delay parameter management module 236 used for obtaining, updating and maintaining delay parameter information established for, or assigned to, respective portions of memory on storage medium 161;

command-delay parameters 182, described above;

power fail module 240 used for detecting a power failure condition on the storage device (e.g., storage device 120, FIG. 1A) and triggering storage of data in volatile memory to non-volatile memory, and optionally working with power fail modules in other memory channel controllers 170 and/or NVM modules 160;

address translation module 242, for translating logical addresses specified in received host commands to physical addresses in storage medium 161, and thereby identifying the memory channel 106 (FIG. 1A), and/or NVM module 160 (FIGS. 1A, 1B, 1C), and/or NVM device 140 to which respective memory commands are to be directed; and address translation table(s) 244.

In some embodiments, delay parameter management module 236 propagates initial or adjusted command-delay parameters to NVM modules 160 or NVM devices 140 in storage medium 161. In some embodiments, delay parameter management module 236 determines how or when to adjust the command-delay parameters; however, in other embodiments that function is performed by host computer 110 or other computer system external to storage device 120 or data storage system 100. In some embodiments, delay parameter management module 236 stores in non-volatile memory a copy of all the command-delay parameters stored in NVM modules 160 and/or NVM devices 140, in command-delay parameters 182.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 202 may store a subset of the modules and data structures identified above. Furthermore, memory 202 may store additional modules and data structures not described above. In some embodiments, the programs, modules, and data structures stored in memory 202, or the non-transitory computer readable storage medium of memory 202, provide instructions for implementing any of the methods described below with reference to FIGS. 4A-4E.

Although FIG. 2B shows a management module 121, FIG. 2B is intended more as functional description of the various features which may be present in a management module than as a structural schematic of the embodiments described herein. In practice, and as recognized by those of ordinary skill in the art, the programs, modules, and data structures shown separately could be combined and some programs, modules, and data structures could be separated.

Figure 3A:
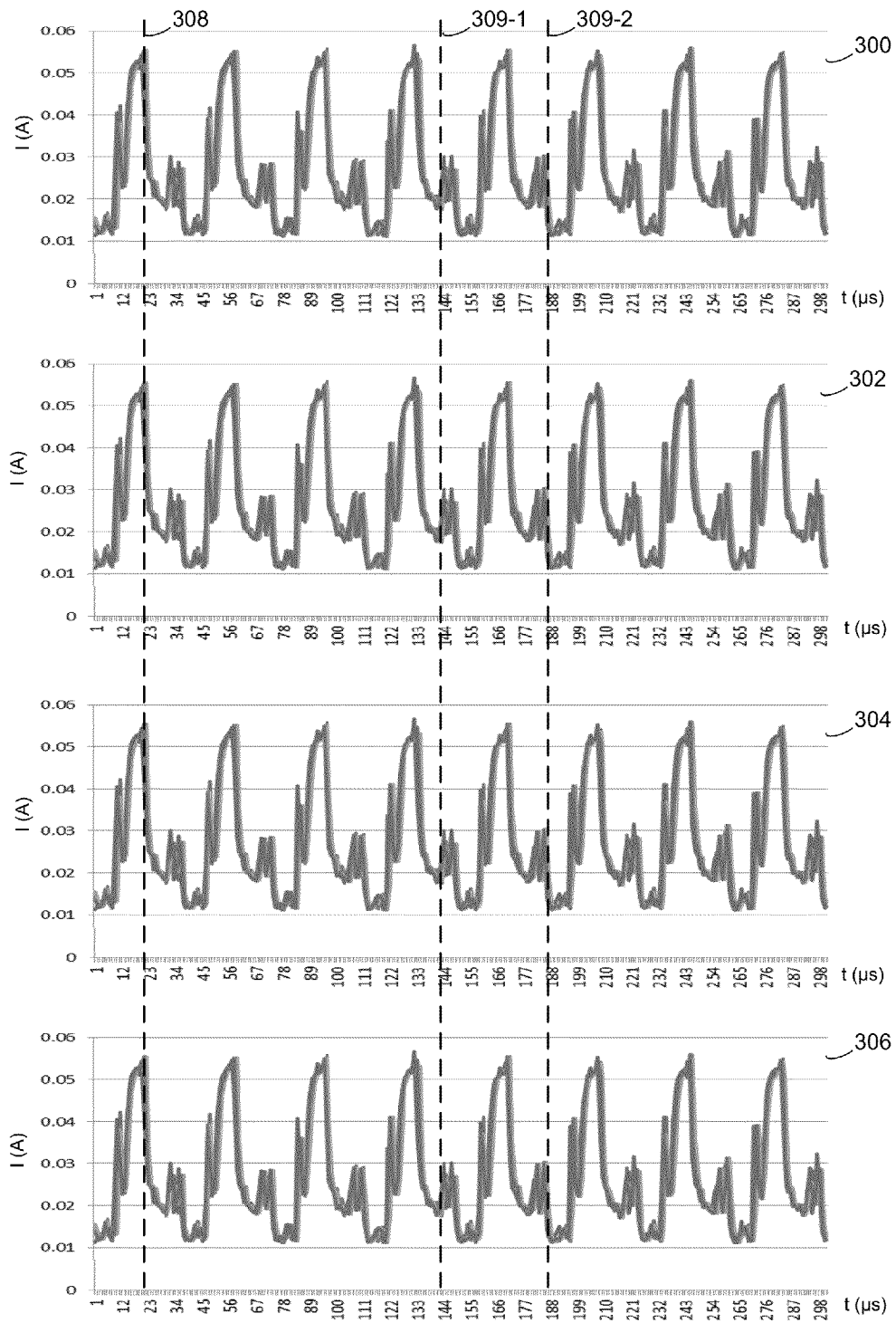
FIGS. 3A-3B illustrate exemplary power signatures for memory operations performed on non-volatile memory devices, in accordance with some embodiments.
Figure 3B:
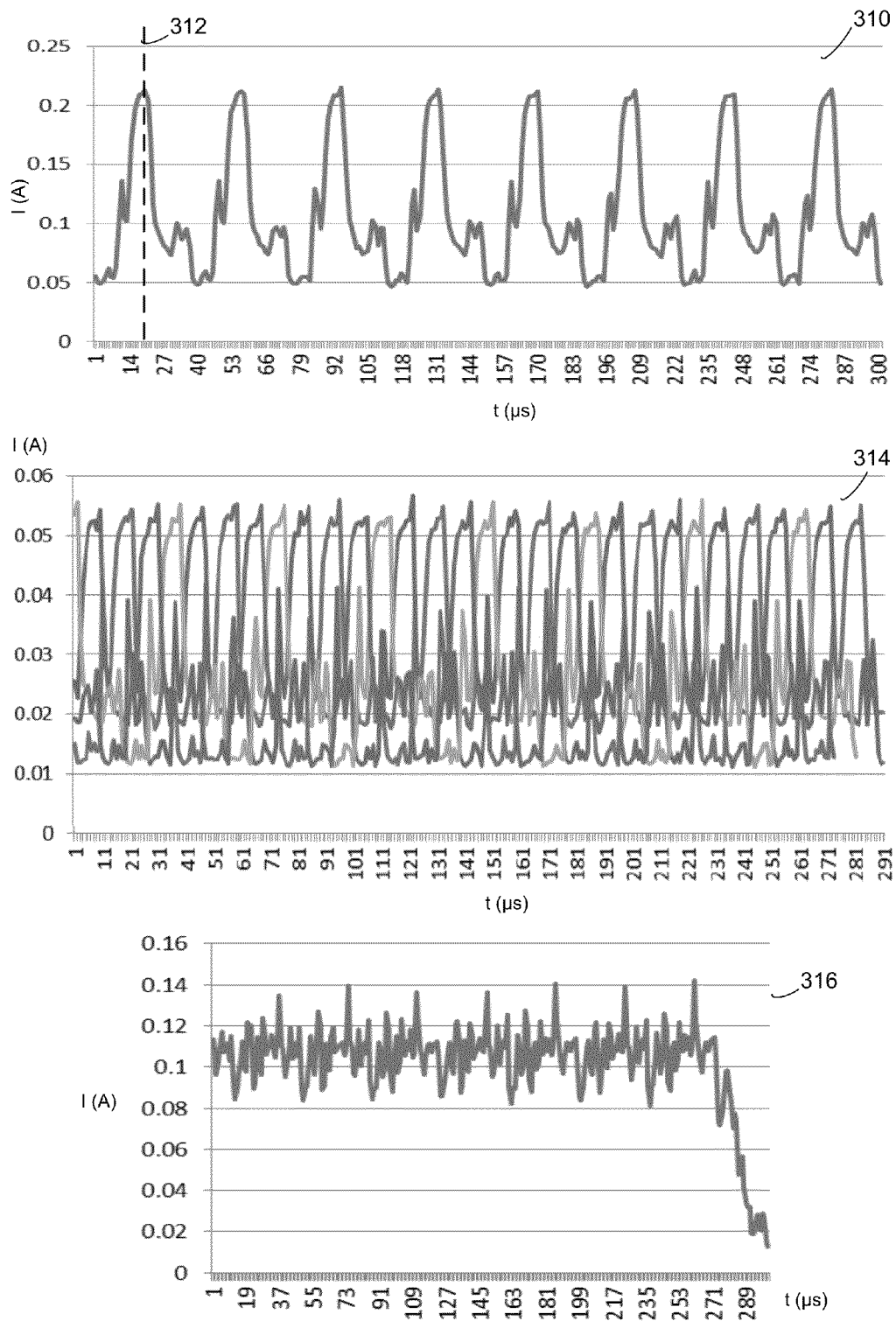
Figure 4A:
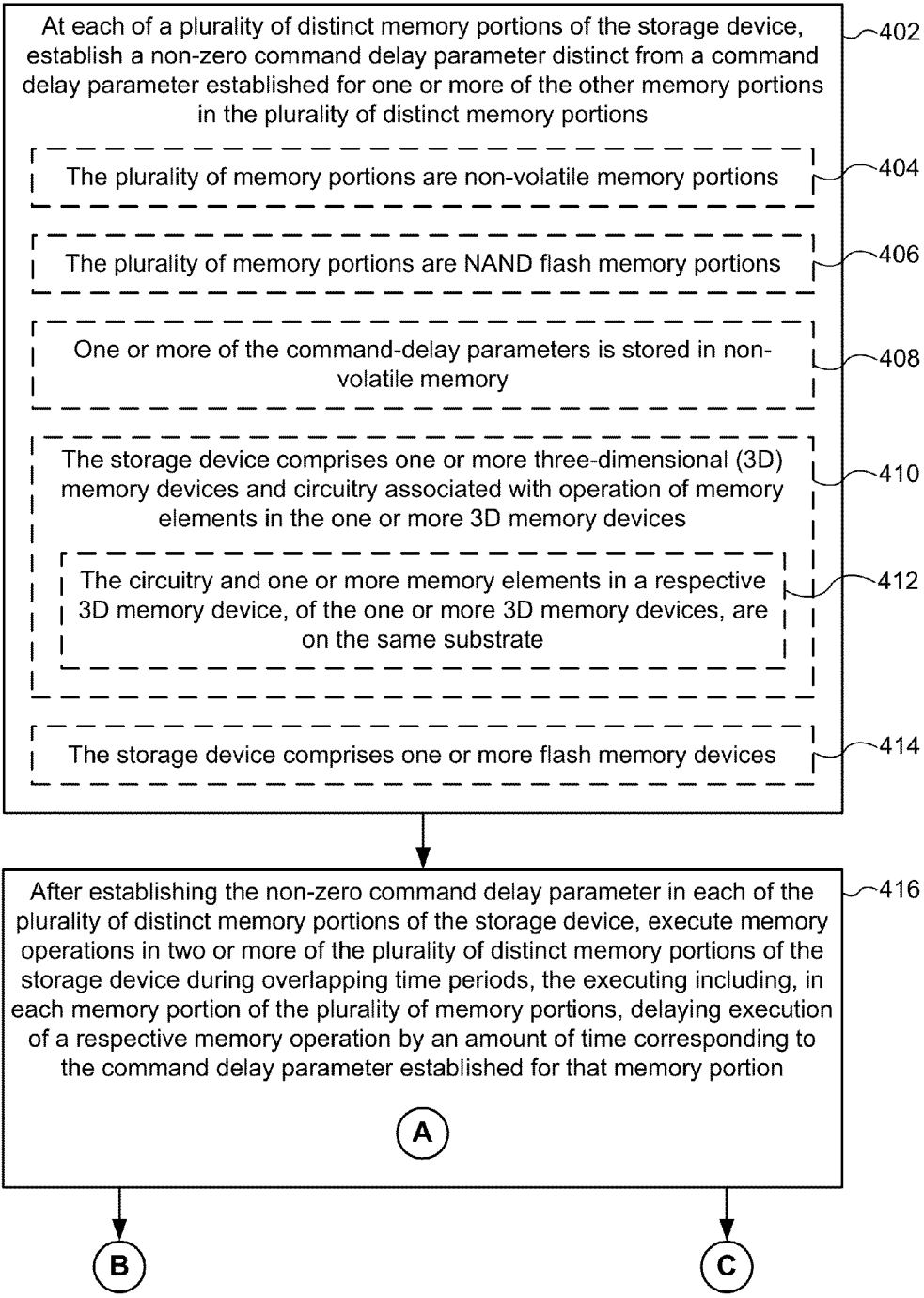
Figure 4B:
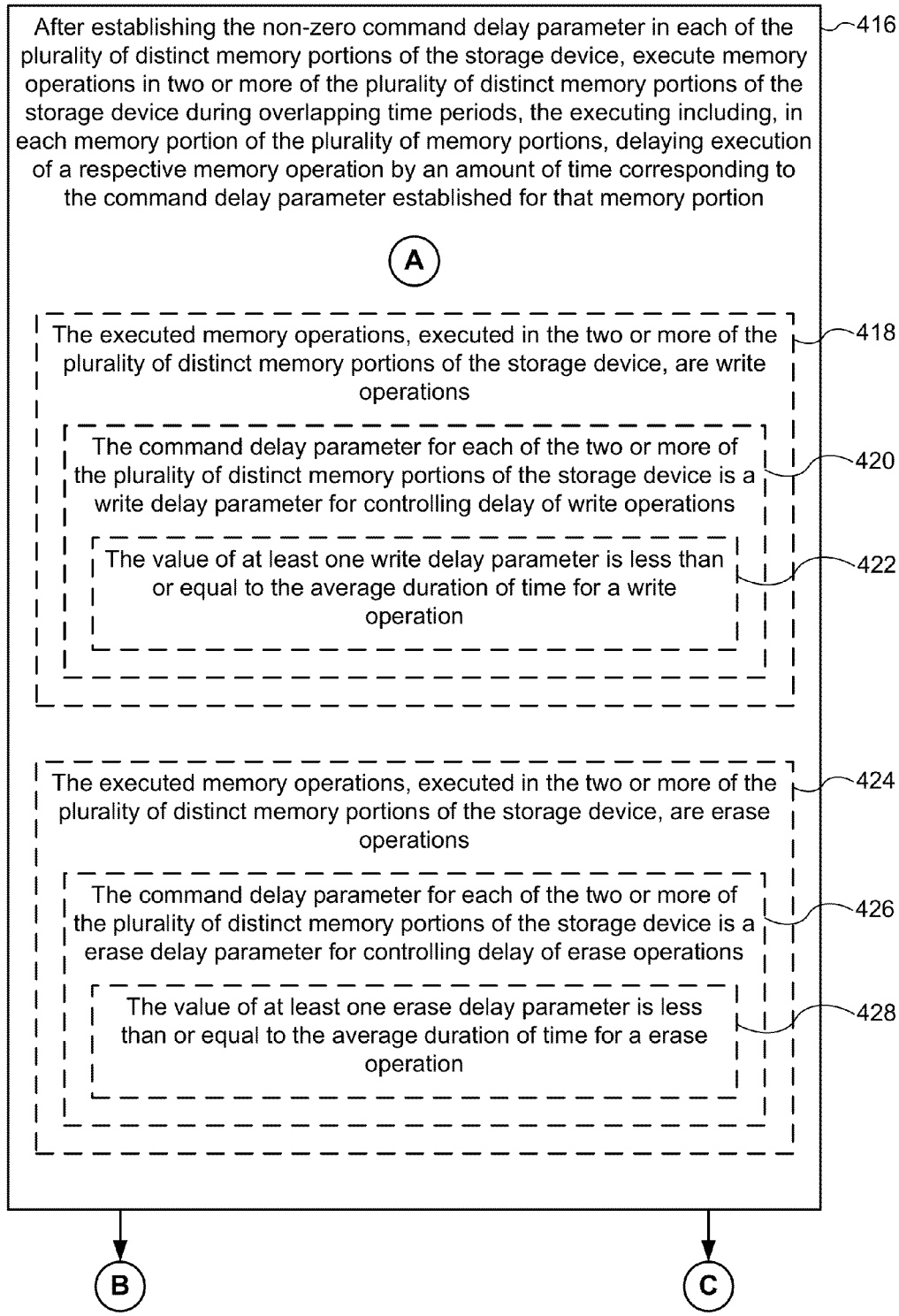
Figure 4C:
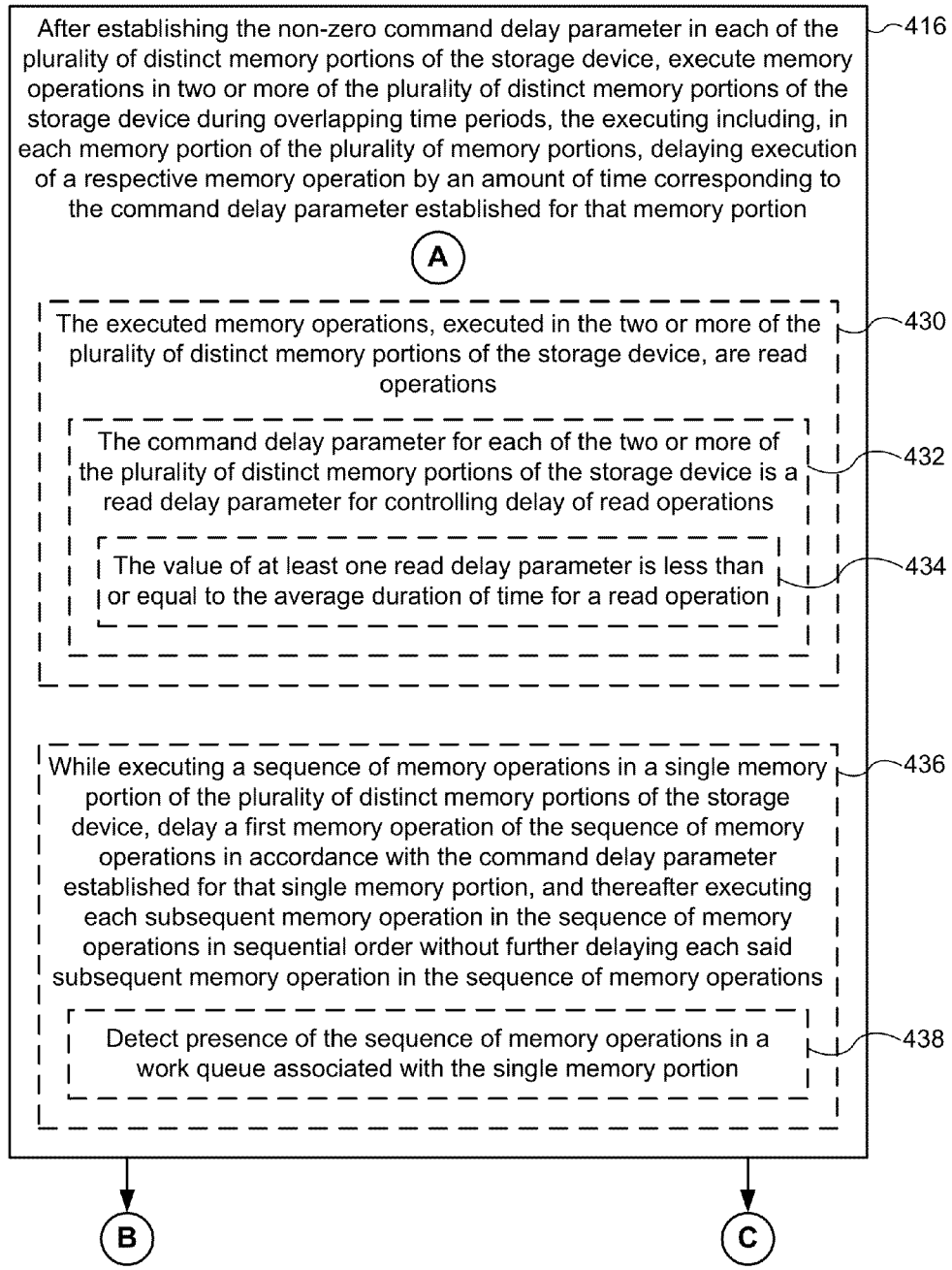
Figure 4D:
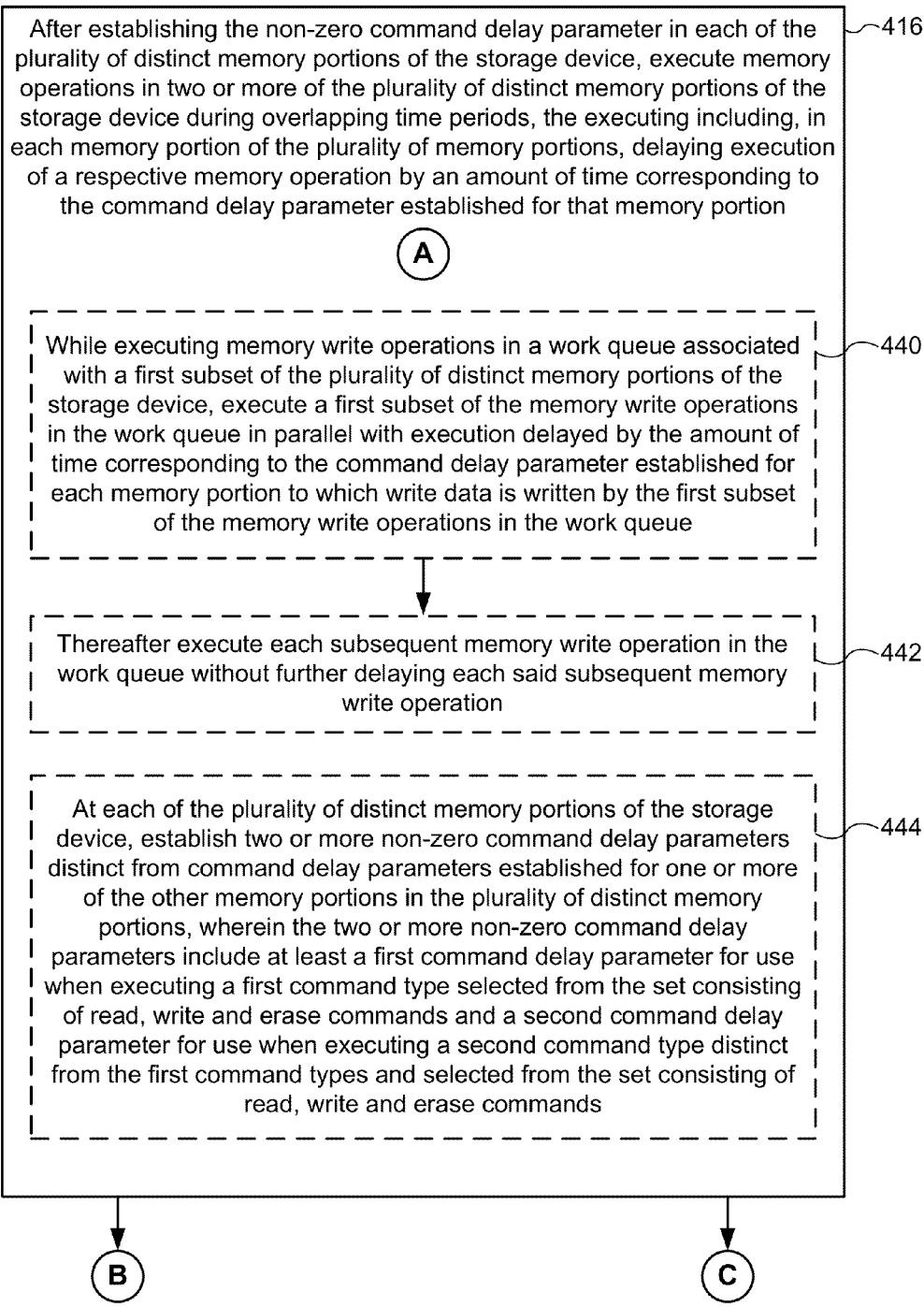

FIGS. 3A-3B illustrate various exemplary power signatures for non-volatile memory devices, in accordance with some embodiments. In FIG. 3A, power signatures 300, 302, 304 and 306 depict graphical representations of current over time for identical memory operations (e.g., a write operation) performed, in some embodiments, over 4 separate, parallel memory channels (e.g., memory channels 106, FIG. 1A) on respective portions of non-volatile memory. Power signature 300, for example, depicts a series of write operations sent over a first memory channel, while power signature 306 depicts a series of write operations sent over a fourth memory channel.

In some embodiments, power signatures 300, 302, 304 and 306 depict power signatures of memory operations being performed in parallel over sub-channels of a single memory channel (e.g., four data buses of an 8-bus memory channel). In some embodiments, power signatures 300, 302, 304 and 306 depict the power signatures of performing memory operations on four different flash memory die in parallel. In some embodiments, two or more memory operations are said to be performed in parallel, if the two or more memory operations are performed during overlapping time periods, or, alternatively, both occur during a given time period that has a duration corresponding to the duration of any one of the memory operations. For example, during the time period between time marker 309-1 and time marker 309-2, four parallel memory operations occur, as seen in the four power signatures, 300, 302, 304 and 306.

In FIG. 3A, time marker 308 is placed at the current peak for a memory operation in power signature 300. In FIG. 3A, this also coincides with the peak of current for memory operations shown in power signatures 302, 304 and 306. In this specific example, time marker 308 is placed at approximately 22 microseconds, as each respective memory operation touched by the marker reaches a peak current of approximately 0.055 A.

FIG. 3B illustrates a graphical representation 310, of the summation of power signatures 300, 302, 304 and 306 shown in FIG. 3A. Time marker 312, placed at approximately 22 microseconds, shows that a current spike of approximately 0.22 A is observed, when the four parallel memory operations marked in FIG. 3A occur at the same time (e.g., over the same period of time or at the same instant).

In contrast, graphical representation 314 illustrates the same four power signatures observed in FIG. 3A, but staggered in their starting times (e.g., delayed). In this example, three of the memory operations are delayed by different non-zero amounts of time, causing the current peaks of the four memory operations to not overlap.

Graphical representation 316 illustrates the summation of power signatures in graphical representation 314. This summation of the staggered power signatures shows a much smoother current, with significantly lower current peaks than in graph 310. Graph 316 illustrates the benefit of determining an appropriate command-delay parameter value per channel, sub-channel or memory portion. Stated another way, by staggering the start times of the memory operations, the current peaks of those operations are also staggered, and as a result, the total peak current is much less than when the start times of the memory operations are not staggered.

It is noted that the graphs in FIGS. 3A and 3B depict a series of the same type of memory operation performed in parallel in different memory channels of a storage device. However, in some embodiments, a variety of memory operations are performed in parallel in different memory channels or different portions of a storage device, and memory command execution staggering is also used in such embodiments to reduce total peak current.

FIGS. 4A-4E illustrate a flowchart representation of method 400 of operating a storage device having a plurality of NVM modules, in accordance with some embodiments. At least in some embodiments, some or all of method 400 is performed by a storage device (e.g., storage device 120, FIG. 1) or one or more components of the storage device (e.g., NVM modules 160, NVM controllers 130 and/or storage device controller 128, FIGS. 1A-1D). In some embodiments, method 400 is governed by instructions that are stored in a non-transitory computer readable storage medium and that are executed by one or more processors of a storage device 120.

The method includes, at each of a plurality of distinct memory portions of the storage device, establishing (402) a non-zero command delay parameter distinct from a command delay parameter established for one or more of the other memory portions in the plurality of distinct memory portions. For example, for a respective memory portion (e.g., a memory channel, an NVM module, or a flash memory die), an erase-command delay parameter of 30 microseconds is established.

It is noted that the aforementioned plurality of distinct memory portions need not include all memory portions of the storage device, in which case memory operations in other portions of the storage device are not delayed. For example, if a storage device has eight distinct memory portions, non-zero command delay parameters may be established in seven of the eight distinct memory portions, while the remaining memory portion has, in effect, no established command delay.

In some embodiments, the plurality of memory portions are (404) non-volatile memory portions, and in some embodiments, the plurality of memory portions are (406) NAND flash memory portions. In some embodiments, one or more of the command-delay parameters is (408) stored in non-volatile memory. For example, one or more of the command-delay parameters is stored in one or more portions of NVM devices 140 in storage medium 161. In some embodiments, the storage device includes (410) one or more three-dimensional (3D) memory devices and circuitry associated with operation of memory elements in the one or more 3D memory devices, and in some embodiments, the circuitry and one or more memory elements in a respective 3D memory device, of the one or more 3D memory devices, are (412) on the same substrate. In some embodiments, the storage device includes (414) one or more flash memory devices.

The method includes, after establishing the non-zero command delay parameter in each of the plurality of distinct memory portions of the storage device, executing (416) memory operations in two or more of the plurality of distinct memory portions of the storage device during overlapping time periods, the executing including, in each memory portion of the plurality of memory portions, delaying execution of a respective memory operation by an amount of time corresponding to the command delay parameter established for that memory portion. For example, for a first flash memory die (e.g., in a first memory channel), an erase-delay parameter having a value of 30 microseconds is established, and for a second flash memory die (e.g., in a second memory channel), an erase-delay parameter having a value of 60 microseconds is established. In this example, a first erase operation to be performed on the first die is delayed by 30 microseconds before its performance, and a second erase operation to be performed on the second die is delayed by 60 microseconds before its performance.

In some embodiments, or in some circumstances, the executed memory operations, executed in the two or more of the plurality of distinct memory portions of the storage device, are (418) write operations, and the command delay parameter for each of the two or more of the plurality of distinct memory portions of the storage device is (420) a write delay parameter for controlling delay of write operations. In some embodiments, the value of at least one write delay parameter is (422) less than or equal to the average duration of time for a write operation. For example, a write operation takes 300 microseconds and the value of at least one write delay parameter is 10 microseconds. In some embodiments, the values of the memory operation delay parameters established for the different memory portions are selected so as to minimize the predicted magnitude of a summed current seen across multiple memory channels or across multiple portions of non-volatile memory.

In some embodiments, or in some circumstances, the executed memory operations, executed in the two or more of the plurality of distinct memory portions of the storage device, are (424) erase operations, and the command delay parameter for each of the two or more of the plurality of distinct memory portions of the storage device is (426) an erase delay parameter for controlling delay of erase operations. In some embodiments, the value of at least one erase delay parameter is (428) less than or equal to the average duration of time for an erase operation.

In some embodiments, or in some circumstances, the executed memory operations, executed in the two or more of the plurality of distinct memory portions of the storage device, are (430) read operations, and the command delay parameter for each of the two or more of the plurality of distinct memory portions of the storage device is (432) a read delay parameter for controlling delay of read operations. In some embodiments, the value of at least one read delay parameter is (434) less than or equal to the average duration of time for a read operation.

In some embodiments, the method includes, while executing a sequence of memory operations in a single memory portion of the plurality of distinct memory portions of the storage device, delaying (436) a first memory operation of the sequence of memory operations in accordance with the command delay parameter established for that single memory portion, and thereafter executing each subsequent memory operation in the sequence of memory operations in sequential order without further delaying each said subsequent memory operation in the sequence of memory operations. For example, ten read operations are sent on a first memory channel to be performed on a first die. The first read operation is delayed by 50 microseconds, the duration of time set by a read-delay parameter for the first die, but the subsequent nine read operations are not delayed. In some embodiments, the command delay parameter established for that single memory portion, is specific to the memory operation being requested (e.g., specific for a read, write or erase operation) and specific that memory portion.

In some embodiments, the method includes detecting (438) the presence of the sequence of memory operations in a work queue associated with the single memory portion, and then applying the methodology described above with reference to operation 436.

In some embodiments, the method includes, while executing memory write operations in a work queue associated with a first subset of the plurality of distinct memory portions of the storage device, executing (440) a first subset of the memory write operations in the work queue in parallel with execution delayed by the amount of time corresponding to the command delay parameter established for each memory portion to which write data is written by the first subset of the memory write operations in the work queue. For example, 100 write operations are loaded in a work queue for four die, where each of the four die resides in one of four distinct memory channels, and 25 write operations are to be performed on each respective die. The first write operations to be performed on each respective die are executed in parallel, where each write operation is delayed by the amount of time corresponding to the write-delay parameter established for the memory channel in which the write operation is performed.

In some embodiments, the method further includes, thereafter executing (442) each subsequent memory write operation in the work queue without further delaying each said subsequent memory write operation.

In some embodiments, the method includes, at each of the plurality of distinct memory portions of the storage device, establishing (444) two or more non-zero command delay parameters distinct from command delay parameters established for one or more of the other memory portions in the plurality of distinct memory portions, where the two or more non-zero command delay parameters include at least a first command delay parameter for use when executing a first command type selected from the set consisting of read, write and erase commands and a second command delay parameter for use when executing a second command type distinct from the first command types and selected from the set consisting of read, write and erase commands. For example, at a first die, a write-delay parameter is established, having a value of 10 microseconds, and an erase-delay parameter is established, having a value of 25 microseconds. Furthermore, in this example, the value of the write-delay parameter for the first die is distinct from the value of a write-delay parameter (e.g., 20 microseconds) for a second die, and the value of an erase-delay parameter for a first die is distinct from the value of an erase-delay parameter (e.g., 50 microseconds) for a second die.

In some embodiments, the method includes adjusting (446) the value of a non-zero command delay parameter corresponding to a first distinct memory portion of the plurality of memory portions. In some circumstances, the value of a command delay parameter corresponding to a first distinct memory portion of the plurality of memory portions is reduced (448) to zero. In some circumstances, the value of a command delay parameter corresponding to a first distinct memory portion of the plurality of memory portions is changed (450) to a new non-zero value. For example, a read-delay parameter is previously established for a first die with a value of 10 microseconds, and is subsequently changed to have a value of 12 microseconds.

In some embodiments, adjustment of the value of a command delay parameter is done in accordance with the age of its corresponding memory portion, or the age of other memory portions of the plurality of memory portions. In some embodiments, adjustment of the value of a command delay parameter is governed by one or more host commands (e.g., received from computer system 110, FIG. 1) to make the adjustment. In some embodiments, adjustment of the value of a command delay parameter is governed by the storage device controller (e.g., storage device controller 128, FIG. 1).

In some embodiments, the method further includes, in an additional memory portion of the storage device, distinct from said plurality of memory portions of the storage device, executing (452) memory operations during the overlapping time periods, without delaying execution of said memory operations in the additional memory portion of the storage device. For example, if non-zero delay parameters are established in seven of the eight memory channels in a storage system, memory devices in the remaining memory channel execute their respective memory operations without any introduced delay.

In some embodiments, the method further includes, in an additional memory portion of the storage device, distinct from said plurality of memory portions of the storage device, establishing (454) a zero command delay parameter distinct from the command delay parameters established for said plurality of distinct memory portions, and executing memory operations in the additional memory portion of the storage device during the overlapping time periods in accordance with the zero command delay parameter. For example, in a storage system, non-zero delay parameters are established in seven of the memory channels of the storage system. The remaining memory channel has a respective command-delay parameter established with a value of zero. In some embodiments, a zero command delay parameter can later be adjusted to have a non-zero value.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible (e.g., a NOR memory array). NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

One of skill in the art will recognize that this invention is not limited to the two dimensional and three dimensional exemplary structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of operation in a storage device, comprising:
during operation of the storage device:

for each of a plurality of distinct memory portions of the storage device, establishing a non-zero value of a command delay parameter, wherein the non-zero value of the command delay parameter is distinct from a value of the command delay parameter established for one or more of the other memory portions in the plurality of distinct memory portions;

after establishing the non-zero value of the command delay parameter in each of the plurality of distinct memory portions of the storage device, executing memory operations in two or more of the plurality of distinct memory portions of the storage device during overlapping time periods, the executing including, in each memory portion of the plurality of memory portions, delaying execution of a respective memory operation by an amount of time corresponding to the non-zero value of the command delay parameter established for that memory portion.

2. The method of claim 1, wherein the plurality of memory portions comprise non-volatile memory portions.

3. The method of claim 1, wherein the plurality of memory portions comprise NAND flash memory portions.

4. The method of claim 1, wherein the storage device comprises one or more flash memory devices.

5. The method of claim 1, wherein the executed memory operations, executed in the two or more of the plurality of distinct memory portions of the storage device, include a plurality of operations of a same memory operation type, wherein the same memory operation type is selected from the group consisting of write operations, read operations and erase operations.

6. The method of claim 5, wherein the command delay parameter for each of the two or more of the plurality of distinct memory portions of the storage device is selected from the group consisting of a write delay parameter for controlling delay of write operations, a read delay parameter for controlling delay of read operations and an erase delay parameter for controlling delay of erase operations.

7. The method of claim 6, wherein the non-zero value of the command delay parameter for each of the two or more of the plurality of distinct memory portions of the storage device is less than or equal to an average duration of time for its corresponding memory operation.

8. The method of claim 1, including, while executing a sequence of memory operations in a single memory portion of the plurality of distinct memory portions of the storage device, delaying a first memory operation of the sequence of memory operations in accordance with the non-zero value of the command delay parameter established for that single memory portion, and thereafter executing each subsequent memory operation in the sequence of memory operations in sequential order without further delaying each said subsequent memory operation in the sequence of memory operations.

9. The method of claim 8, including detecting presence of the sequence of memory operations in a work queue associated with the single memory portion.

10. The method of claim 1, further comprising:
while executing memory write operations in a work queue associated with a first subset of the plurality of distinct memory portions of the storage device, executing a first subset of the memory write operations in the work queue in parallel with execution delayed by the amount of time corresponding to the non-zero value of the command delay parameter established for each memory portion to which write data is written by the first subset of the memory write operations in the work queue, and thereafter executing each subsequent memory write operation in the work queue without further delaying each said subsequent memory write operation.

11. The method of claim 1, wherein one or more of the command delay parameters is stored in non-volatile memory.

12. The method of claim 1, further comprising, in an additional memory portion of the storage device, distinct from said plurality of memory portions of the storage device, executing memory operations during the overlapping time periods, without delaying execution of said memory operations in the additional memory portion of the storage device.

13. The method of claim 1, further comprising at an additional memory portion of the storage device, distinct from said plurality of memory portions of the storage device, establishing a zero value for a command delay parameter distinct from the command delay parameters established for said plurality of distinct memory portions, and executing memory operations in the additional memory portion of the storage device during the overlapping time periods in accordance with the zero value for the command delay parameter.

14. The method of claim 1, further comprising, for each of the plurality of distinct memory portions of the storage device, establishing non-zero values for two or more command delay parameters distinct from command delay parameters established for one or more of the other memory portions in the plurality of distinct memory portions, wherein the two or more command delay parameters include at least a first command delay parameter for use when executing a first command type selected from the set consisting of read, write and erase commands and a second command delay parameter for use when executing a second command type distinct from the first command type and selected from the set consisting of read, write and erase commands.

15. The method of claim 1, further comprising:
after establishing the non-zero value of the command delay parameter in each of the plurality of distinct memory portions of the storage device, and after delaying execution of a respective memory operation in each of the plurality of distinct memory portions by an amount of time corresponding to the non-zero value of the command delay parameter established for that memory portion:
adjusting the non-zero value of the command delay parameter corresponding to a first distinct memory portion of the plurality of memory portions.

16. The method of claim 15, wherein adjusting the non-zero value of the command delay parameter corresponding to a first distinct memory portion of the plurality of memory portions comprises:
reducing the value of the command delay parameter corresponding to a first distinct memory portion of the plurality of memory portions, to zero.

17. The method of claim 15, wherein adjusting the non-zero value of the command delay parameter corresponding to a first distinct memory portion of the plurality of memory portions comprises:
changing the value of the command delay parameter corresponding to a first distinct memory portion of the plurality of memory portions, to a new non-zero value.

18. The method of claim 1, wherein the storage device comprises one or more three-dimensional (3D) memory devices and circuitry associated with operation of memory elements in the one or more 3D memory devices.

19. The method of claim 18, wherein the circuitry and one or more memory elements in a respective 3D memory device, of the one or more 3D memory devices, are on the same substrate.

20. The method of claim 1, further comprising adjusting the non-zero value of the command delay parameter in accordance with an age of the corresponding memory portion.

21. A storage device, comprising:
- an interface for coupling the storage device to a host system;
- non-volatile memory, including multiple distinct memory portions of the non-volatile memory; and
- a set of one or more storage controllers, having one or more processors, the set of one or more storage controllers configured to:
  - during operation of the storage device:
    - for each of a plurality of distinct memory portions of the storage device, establishing a non-zero value of a command delay parameter, wherein the non-zero value of the command delay parameter is distinct from a value of the command delay parameter established for one or more of the other memory portions in the plurality of distinct memory portions;
    - after establishing the non-zero value of the command delay parameter in each of the plurality of distinct memory portions of the storage device, executing memory operations in two or more of the plurality of distinct memory portions of the storage device during overlapping time periods, the executing including, in each memory portion of the plurality of memory portions, delaying execution of a respective memory operation by an amount of time corresponding to the non-zero value of the command delay parameter established for that memory portion.

22. The storage device of claim 21, wherein the plurality of memory portions comprises NAND flash memory portions.

23. The storage device of claim 21, wherein the executed memory operations, executed in the two or more of the plurality of distinct memory portions of the storage device, include a plurality of operations of a same memory operation type, wherein the same memory operation type is selected from the group consisting of write operations, read operations and erase operations.

24. The storage device of claim 23, wherein the command delay parameter for each of the two or more of the plurality of distinct memory portions of the storage device is selected from the group consisting of a write delay parameter for controlling delay of write operations, a read delay parameter for controlling delay of read operations and an erase delay parameter for controlling delay of erase operations.

25. The storage device of claim 21, wherein the set of one or more storage controllers is configured to, for each of the plurality of distinct memory portions of the storage device, establish non-zero values for two or more command delay parameters distinct from command delay parameters established for one or more of the other memory portions in the plurality of distinct memory portions, wherein the two or more command delay parameters include at least a first command delay parameter for use when executing a first command type selected from the set consisting of read, write and erase commands and a second command delay parameter for use when executing a second command type distinct from the first command type and selected from the set consisting of read, write and erase commands.

26. A non-transitory computer readable storage medium, storing one or more programs for execution by one or more processors of a storage device, the one or more programs including instructions for:
- during operation of the storage device:
  - for each of a plurality of distinct memory portions of the storage device, establishing a non-zero value of a command delay parameter, wherein the non-zero value of the command delay parameter is distinct from a value of the command delay parameter established for one or more of the other memory portions in the plurality of distinct memory portions;
  - after establishing the non-zero value of the command delay parameter in each of the plurality of distinct memory portions of the storage device, executing memory operations in two or more of the plurality of distinct memory portions of the storage device during overlapping time periods, the executing including, in each memory portion of the plurality of memory portions, delaying execution of a respective memory operation by an amount of time corresponding to the non-zero value of the command delay parameter established for that memory portion.

* * * * *